(12) United States Patent
Yesin et al.

(10) Patent No.: US 8,405,992 B2
(45) Date of Patent: Mar. 26, 2013

(54) POWER-ELECTRONIC ARRANGEMENT

(75) Inventors: Berk Yesin, Zurich (CH); Bruno Agostini, Dietikon (CH); Christoph Haederli, Zürich (CH); Chunlei Liu, Zürich (CH); Francesco Agostini, Zofingen (CH); Hamit Duran, Turgi (CH); Slavo Kicin, Zürich (CH)

(73) Assignee: ABB Research Ltd., Zurich (CH)

( * ) Notice: Subject to any disclaimer, the term of this patent is extended or adjusted under 35 U.S.C. 154(b) by 211 days.

(21) Appl. No.: 12/896,031

(22) Filed: Oct. 1, 2010

(65) Prior Publication Data

US 2011/0080711 A1 Apr. 7, 2011

(30) Foreign Application Priority Data

Oct. 2, 2009 (EP) .................................. 09012507

(51) Int. Cl.
*H05K 7/20* (2006.01)
*F28F 7/00* (2006.01)
*H01L 23/34* (2006.01)

(52) U.S. Cl. .............. 361/700; 361/679.52; 361/679.53; 165/80.4; 165/80.5; 165/104.33; 257/715; 257/E23.088; 363/141; 174/15.2

(58) Field of Classification Search ............ 361/679.46–679.54; 165/80.4–80.5, 104.33; 257/715, 257/E23.088; 174/15.2; 353/141
See application file for complete search history.

(56) References Cited

U.S. PATENT DOCUMENTS

| | | | |
|---|---|---|---|
| 3,829,740 A * | 8/1974 | Beasley .................. | 361/697 |
| 4,995,451 A | 2/1991 | Hamburgen | |
| 5,168,919 A | 12/1992 | Berenholz et al. | |
| 6,073,683 A * | 6/2000 | Osakabe et al. ......... | 165/104.33 |
| 6,084,771 A | 7/2000 | Ranchy et al. | |
| 6,166,937 A | 12/2000 | Yamamura et al. | |
| 6,809,424 B2 | 10/2004 | Pike et al. | |
| 7,547,966 B2 * | 6/2009 | Funakoshi et al. ........... | 257/707 |
| 2001/0033477 A1 * | 10/2001 | Inoue et al. .................. | 361/718 |
| 2002/0001177 A1 * | 1/2002 | Petitbon ....................... | 361/690 |
| 2002/0075652 A1 | 6/2002 | Berchowitz | |
| 2007/0133175 A1 | 6/2007 | Wu | |
| 2009/0056916 A1 * | 3/2009 | Yesin et al. .............. | 165/104.21 |

FOREIGN PATENT DOCUMENTS

| | | |
|---|---|---|
| DE | 4322665 A1 | 1/1994 |
| JP | 11346480 A | 12/1999 |
| WO | 2006078070 A2 | 7/2006 |

OTHER PUBLICATIONS

European Search Report, dated Mar. 11, 2010, from corresponding European application.
Office Action, dated Jan. 27, 2011, in Application 09012507.1.

* cited by examiner

*Primary Examiner* — Zachary M Pape
(74) *Attorney, Agent, or Firm* — Young & Thompson

(57) ABSTRACT

A power-electronic arrangement comprising semiconductor components (102, 103, 107), a heat exchanger (110), and an electrically conductive element (109) is presented. The heat exchanger comprises evaporator channels (111) and condenser channels (112) for working fluid. The electrically conductive element comprises a contact surface providing a thermal contact to outer surfaces of walls of the evaporator channels for transferring heat from the electrically conductive element to the evaporator channels. A main current terminal of each semiconductor component is bonded to the electrically conductive element which thus forms a part of a main current circuitry of a power system. As the main current terminal is directly bonded to the electrically conductive element cooled with the heat exchanger, the temperature gradients inside the semiconductor components can be kept moderate, and thus the temperatures inside the semiconductor components can be limited.

15 Claims, 5 Drawing Sheets

POWER-ELECTRONIC ARRANGEMENT

FIELD OF THE INVENTION

The invention relates to a power-electronic arrangement that comprises one or more semiconductor components and a heat exchanger for cooling the semiconductor components. Furthermore, the invention relates to a method for providing a cooling arrangement for one or more semiconductor components. Furthermore, the invention relates to an electrical converter device.

BACKGROUND

In a typical power-electronic system, power-electronic components such as discrete or integrated semiconductor components, inductors, resistors, capacitors and bus-bars are assembled in close proximity. During operation, these components dissipate heat of varying quantities. In addition, these components are tolerant to temperatures of varying levels. The environmental conditions surrounding the power-electronic system may also vary in terms of air temperature, humidity, dust and chemical content. The thermal management and integration concept of a power-electronic system has to consider all of these underlined factors in addition to the electrical performance of the power-electronic system.

Publication US2007/0133175 discloses a heat dissipation device that is suitable for dissipating heat from an electronic device, e.g. an integrated circuit (IC), a semiconductor component, or a module comprising two or more semiconductor components. The heat dissipation device comprises a base plate for contacting the electronic device to absorb heat therefrom. The heat dissipation device further comprises a heat dissipation member provided with two heat-dissipating plate groups intercrossed with each other and defining a plurality of air passages. The heat dissipation device further comprises heat pipes arranged to connect the heat dissipation member with the base plate for transferring heat from the base plate to the heat dissipation member. The heat dissipation device may further comprise one or more additional heat sink elements on the outer surface of the heat dissipation member. The base plate of the heat dissipation device is in contact with a package of an electronic device to be cooled. Hence, especially in hard loading conditions, considerable temperature gradients may be present inside the electronic device even if the above-described heat dissipation device were able to keep the base plate at a relatively moderate temperature. Hence, certain spots, i.e. "hot spots", inside the electronic device may, in some situations, get relatively hot although the base plate would be at a relatively moderate temperature.

SUMMARY

In accordance with a first aspect of the invention, there is provided a new power-electronic arrangement. A power-electronic arrangement according to the invention comprises:
  one or more semiconductor components,
    a heat exchanger comprising at least one evaporator channel for working fluid and at least one condenser channel for the working fluid, and
    an electrically conductive element,
  wherein the electrically conductive element comprises a contact surface providing a thermal contact to an outer surface of a wall of the evaporator channel for transferring heat from the electrically conductive element to the evaporator channel, and a main current terminal of each of the one or more semiconductor components is bonded to the electrically conductive element.

As the main current terminal of each semiconductor component is directly bonded to the electrically conductive element that is arranged to be cooled with the heat exchanger, the thermal resistance between the active parts of the semiconductor component and the above-mentioned electrically conductive element can be small. Therefore, temperature gradients inside the semiconductor components can be kept moderate and thus the temperatures inside the semiconductor components can be limited. The main current terminal can be, for example but not necessarily, a collector of an insulated gate bipolar transistor, a cathode of a diode, a cathode of a thyristor, or a cathode of a gate turn-off thyristor. The main current terminal can be bonded to the electrically conductive element by any suitable bonding method e.g. by soldering or sintering.

In accordance with a second aspect of the invention, there is provided a new method for providing a cooling arrangement for one or more semiconductor components. The method according to the invention comprises:
  providing at least one evaporator channel for working fluid and at least one condenser channel for the working fluid,
  providing a thermal contact from an electrically conductive element to an outer surface of a wall of the evaporator channel for transferring heat from the electrically conductive element to the evaporator channel, and
  bonding a main current terminal of each semiconductor component to the electrically conductive element.

In accordance with a third aspect of the invention, there is provided a new electrical converter device. The electrical converter device comprises at least one power-electronic arrangement according to the invention, wherein the electrically conductive element of the power-electronic arrangement constitutes a part of a main current circuitry of the electrical converter device. The electrical converter device can be, for example but not necessarily, an inverter, a rectifier, and/or a frequency converter.

A number of exemplifying embodiments of the invention are described in accompanied dependent claims.

Various embodiments of the invention both as to constructions and to methods of operation, together with additional objects and advantages thereof, will be best understood from the following description of specific exemplifying embodiments when read in connection with the accompanying drawings.

The verb "to comprise" is used in this document as an open limitation that neither excludes nor requires the existence of also unrecited features. The features recited in the depending claims are mutually freely combinable unless otherwise explicitly stated.

BRIEF DESCRIPTION OF THE FIGURES

The exemplifying embodiments of the invention and their advantages are explained in greater detail below in the sense of examples and with reference to the accompanying drawings, in which.

DESCRIPTION OF THE EMBODIMENTS

Figures 1A, 1B:
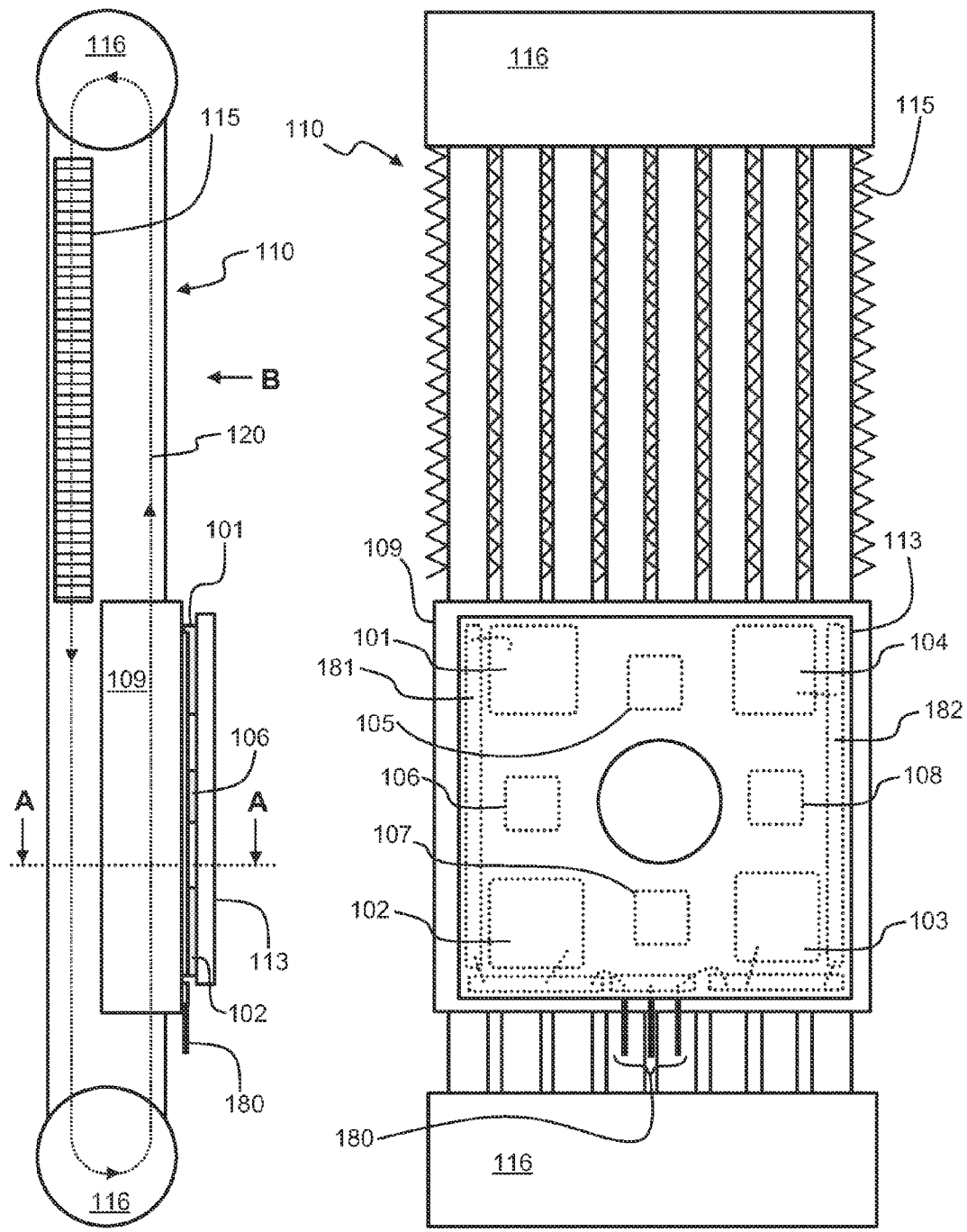
FIG. 1a shows a side view of a power-electronic arrangement according to an embodiment of the invention.
FIG. 1b shows another side view of the power-electronic arrangement shown in FIG. 1a, the side view shown in FIG. 1b being seen along the direction B shown in FIG. 1a, FIG. 1c shows a section view of the power-electronic arrangement shown in FIG. 1a, the section being taken along the line A-A shown in FIG. 1a, FIG. 2 shows a section view of a power-electronic arrangement according to an embodiment of the invention.
Figure 1C:
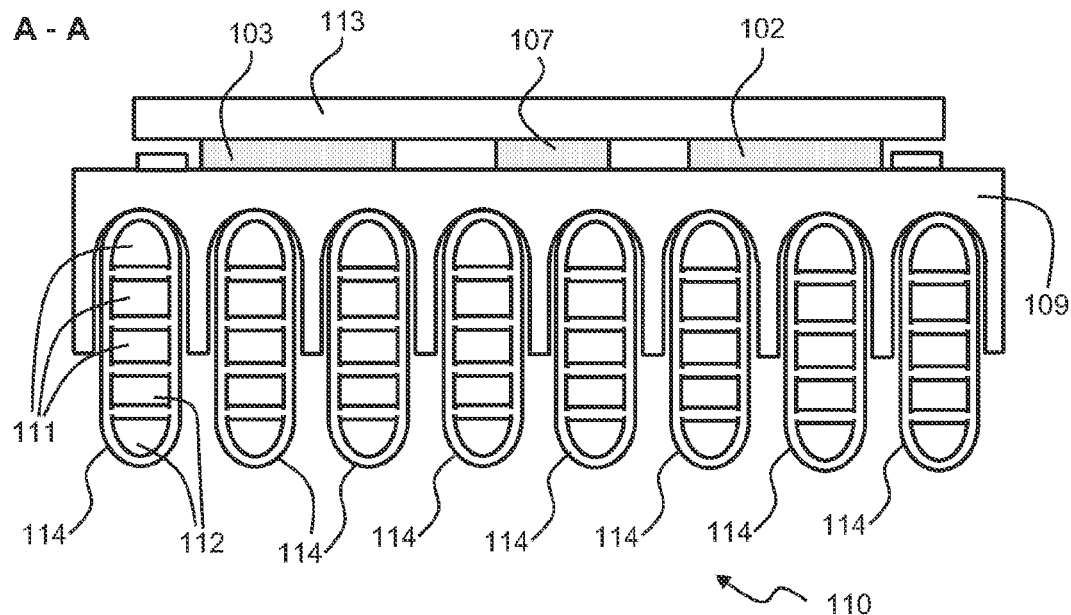

FIG. 1a shows a side view of a power-electronic arrangement according to an embodiment of the invention and FIG. 1b shows another side view of the power-electronic arrangement shown in FIG. 1a. The side view shown in FIG. 1b is seen from the direction B shown in FIG. 1a. FIG. 1c shows a section view of the power-electronic arrangement shown in FIG. 1a, wherein the section is taken along the line A-A shown in FIG. 1a. The power-electronic arrangement comprises semiconductor components 101, 102, 103, 104, 105, 106, 107 and 108, electrically conductive elements 109 and 113, and a heat exchanger 110. The electrically conductive elements 109 and 113 can be, for example but not necessarily, of copper or aluminum. The heat exchanger comprises evaporator channels 111 for working fluid and condenser channels 112 for the working fluid; see FIG. 1c. The electrically conductive element 109 comprises a contact surface arranged to provide a thermal contact to an outer surface of walls of the evaporator channels 111 for transferring heat from the electrically conductive element 109 to the evaporator channels. The heat exchanger works with the loop thermosyphon principle. Hence, there is no need for a pumping unit. The closed dashed line 120 in FIG. 1a illustrates the circulation of the working fluid. The working fluid can be any suitable refrigerant fluid such as, for example but not necessarily, R134a, R245fa, R365mfc, R600a, carbon dioxide, methanol, or ammonia. In the embodiment of the invention shown in FIGS. 1a-1c, the evaporator channels and the condenser channels are formed with conduits 114 each of which being a planar tube having planar side walls and interior walls between the side walls. Tubes 116 at the ends of the conduits constitute distribution manifolds. It should be, however, noted that there are numerous different mechanical constructions that can be used for forming the evaporator and condenser channels. For example, each evaporator channel can be a separate tube connected to distribution manifolds or to other end-structures interconnecting the ends of the evaporator and condenser channels. Correspondingly, each condenser channel can be a separate tube connected to the distribution manifolds or to the other end-structures interconnecting the ends of the evaporator and condenser channels. The heat exchanger 110 may further comprise cooling fins 115 on a portion of an outer surface of walls of the condenser channels and/or heating fins (not shown) on a portion of an outer surface of walls of the evaporator channels.

A first main current terminal of each of the semiconductor components 101-108 is bonded to the electrically conductive element 109 and a second main current terminal of each of the semiconductor components is bonded to the other electrically conductive element 113 so that the semiconductor components are sandwiched between the electrically conductive elements 109 and 113 as illustrated in FIGS. 1a and 1c. Hence, an active part of each semiconductor component is directly bonded to the electrically conductive element 109 that is arranged to be cooled with the heat exchanger 110. Therefore, the temperature gradients inside the semiconductor components 101-108 can be kept moderate, and thus the temperatures inside the semiconductor components can be limited.

The main current terminals of the semiconductor components can be bonded to the electrically conductive elements 109 and 113 by any suitable bonding method e.g. by soldering or sintering. A main current terminal is an area on a surface of a relevant semiconductor component and the bonding can be a layer of electrically conductive adhering material, e.g. solder or sintering material, between the main current terminal and the electrically conductive element 109 or 113. If the electrically conductive element is made of aluminum, solders like Sn—Zn (199° C. melting point) or Zn—Al (382° C. melting point) can be used to solder the main current terminals to aluminum with help of active flux which removes oxides and promote wetting. If standard soft soldering (Pb—Sn) is used, a Cu metallization, a Ni/Cu metallization, or a Ni/Cu/Au metallization is needed. Ni/Ag or Ni/Cu/Au plating is needed for Ag sintering that can be made with sintering material comprising e.g. 100 nm Cr, 200 nm Ni and 3 μm Ag. The CTE (Coefficient of Temperature Expansion) of aluminum and silicon are quite different and, hence, it is preferred to put an electrically and thermally conductive material such as molybdenum between the main current terminals and the electrically conductive element to improve the reliability. Molybdenum has a moderate CTE between those of silicon and aluminum. However molybdenum must brazed on aluminum at high temperature to have good mechanical properties, otherwise there may be a reliability problem at the Mo/Al interface. Other materials to act as CTE matching buffers can be, for example, Al based MMC (Metal Matrix Composites such as Al graphite, even AlSiC). The bonding techniques of the kind described above provide good thermal contacts between the main current terminals and the electrically conductive elements. The space between the electrically conductive elements 109 and 113 and around the semiconductor components can be filled with electrically insulating encapsulation material such as, for example, plastics or resin.

Each of the semiconductor components 101-108 can be, for example but not necessarily, one of the following: an insulated gate bipolar transistor (IGBT), a field effect transistor (FET), a gate turn-off thyristor (GTO), a thyristor, or a diode. A first main current terminal that is bonded to the element 109 can be, for example but not necessarily, a collector of an insulated gate bipolar transistor (IGBT), a cathode of a diode, a cathode of a thyristor, a cathode of a gate turn-off thyristor (GTO), or a drain of a field effect transistor (FET). A second main current terminal that is bonded to the element 113 can be, for example but not necessarily, an emitter of an insulated gate bipolar transistor (IGBT), an anode of a diode, an anode of a thyristor, an anode of a gate turn-off thyristor (GTO), or a source of a field effect transistor (FET).

In a power electronic arrangement according to an embodiment of the invention, the semiconductor components 101-104 are insulated gate bipolar transistors (IGBT) whose collectors are bonded to the electrically conductive element 109 and whose emitters are bonded to the electrically conductive element 113, and the semiconductor components 105-106 are diodes that are anti-parallel to the IGBTs.

In a power electronic arrangement according to an embodiment of the invention, the electrically conductive element 109 is used also as a mechanical support element for arranging wiring for control signals of the semiconductor components.

In FIG. 1b, the oblong rectangles 181 and 182 depicted with dashed lines represent wiring structures which are used for arranging wiring between a control terminal 180 of the power electronic arrangement and the control terminals of the semiconductor components 101, 102, 103, and 104. The wiring structures can be made of e.g. direct copper bonding (DCB) substrate materials, e.g. aluminum-oxide. For example, in an arrangement according to an embodiment of the invention, the middle pin of the control terminal 180 is connected to gates of IGBTs, and the two additional pins on the sides are connected to emitters and collectors of the IGBTs for use by a gate-driver circuitry.

Figure 2:
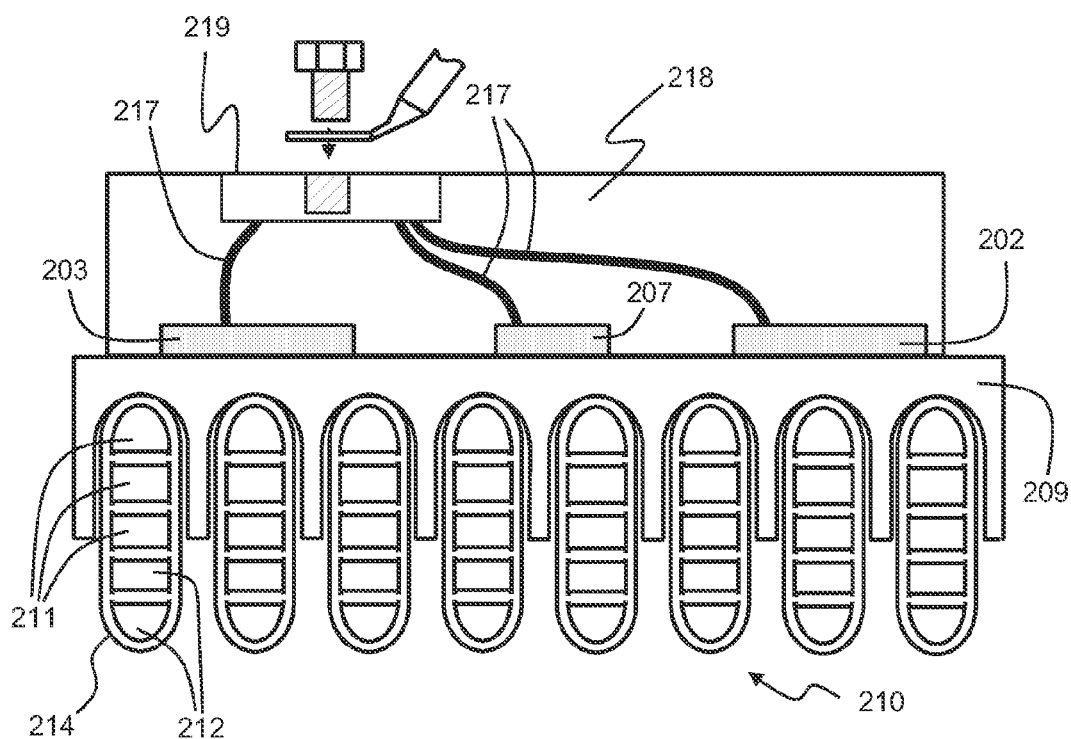

FIG. 2 shows a section view of a power-electronic arrangement according to an embodiment of the invention. The section is taken in a similar manner as the section shown in FIG. 1c. The power-electronic arrangement comprises semiconductor components 202, 203, and 207, an electrically conductive element 109, and a heat exchanger 210. The heat exchanger comprises evaporator channels 211 for working fluid and condenser channels 212 for the working fluid. The electrically conductive element 209 comprises a contact surface arranged to provide a thermal contact to an outer surface of walls of the evaporator channels for transferring heat from the electrically conductive element 209 to the evaporator channels 211. A first main current terminal of each of the semiconductor components is bonded to the electrically conductive element 209. A second main current terminal of each of the semiconductor components is connected to a connection terminal 219 via a wire bond 217. An area 218 is filled with electrically insulating encapsulation material such as, for example, plastics or resin.

Figure 3A:
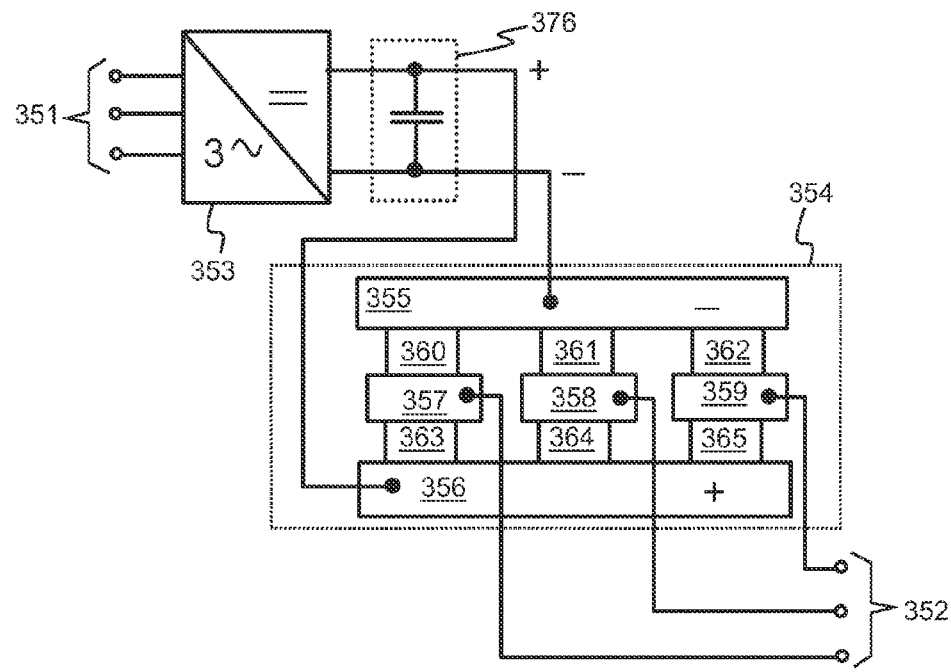
FIG. 3a shows an electrical converter device according to an embodiment of the invention.

An electrical converter device according to an embodiment of the invention comprises at least one power-electronic arrangement according to an embodiment of the invention. The electrical converter device can be, for example but not necessarily, an inverter, a rectifier, and/or a frequency converter. FIG. 3a shows an electrical converter device according to an embodiment of the invention. The electrical converter device comprises an electrical terminal 351 for connecting the electrical converter device to an alternating voltage network (not shown) and an electrical terminal 352 for connecting the electrical converter device to a load (not shown) that can be e.g. an induction motor. The electrical converter device comprises a converter unit 353 that can be e.g. a rectifier that is arranged to transfer energy from the alternating voltage network to an intermediate circuit 376 of the electrical converter device. The converter unit 353 can be as well a device that is capable of transferring energy not only from the alternating voltage network to the intermediate circuit 376 but also from the intermediate circuit back to the alternating voltage network.

The electrical converter device comprises an inverter bridge 354 that is able to transfer energy from the intermediate circuit 376 to the load and also to transfer energy from the load to the intermediate circuit. The main circuit of the inverter bridge comprises bus-bars 355 and 356 that are connected to the intermediate circuit, and bus-bars 357, 358, and 359 that are connected to different phases of the electrical terminal 352. The main circuit of the inverter bridge comprises power-electronic arrangements 360, 361, 362, 363, 364, and 365 that are pressed between the bus-bars 355-359 as shown in FIG. 3a. Each of the power-electronic arrangements 360-365 comprises:
  one or more semiconductor components,
  a first electrically conductive element,
  a second electrically conductive element, and
  a heat exchanger comprising at least one evaporator channel for working fluid and at least one condenser channel for the working fluid,
wherein the first electrically conductive element comprises a contact surface providing a thermal contact to an outer surface of a wall of the evaporator channel for transferring heat from the first electrically conductive element to the evaporator channel, a first main current terminal of each of the one or more semiconductor components is bonded to the first electrically conductive element, and a second main current terminal of each of the one or more semiconductor components is bonded to the second electrically conductive element so that the one or more semiconductor components are sandwiched between the first and second electrically conductive elements.

As the heat exchangers of the power-electronic arrangements 360-365 work with the loop thermosyphon principle and thus there is no need for pumping units, the fact that the heat exchangers are on potential relative to the ground does not substantially, if at all, complicate the electromechanical design of the electrical converter device.

Figure 3B:
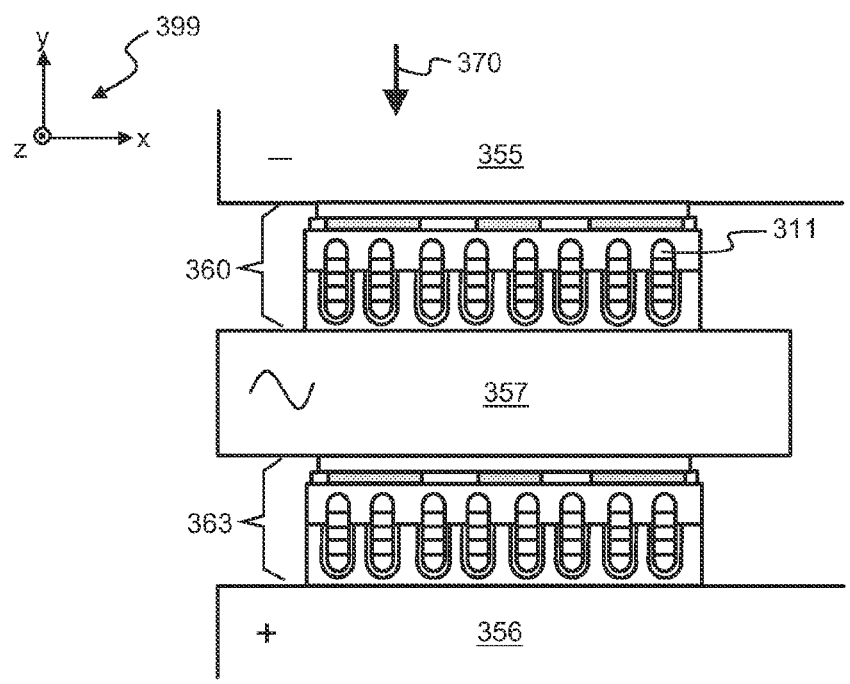
FIG. 3b shows a section view of a detail of the electrical converter device shown in FIG. 3a, FIG. 4a shows an electrical converter device according to an embodiment of the invention.

The power-electronic arrangements 360-365 can be, for example, according to what is described in FIGS. 1a, 1b and 1c and in the text passages related to these figures. The outer surfaces of the first and second electrically conductive elements of the power-electronic arrangements 360-365 are pressed against the bus-bars 355-359. This is illustrated in FIG. 3b for the power-electronic arrangements 360 and 363. The power-electronic arrangements 360 and 363 are depicted in FIG. 3b as section views that are similar to that shown in FIG. 1c. The reference number 311 represents one of the evaporation channels of the power-electronic arrangement 360. The semiconductor components of each of the power-electronic arrangements 360-365 may comprise, for example, one or more insulated gate bipolar transistors (IGBT) and one or more diodes that are anti-parallel to the IGBTs.

An angle between a horizontal plane and the evaporator and condenser channels of the power-electronic arrangements 360-365 is preferably at least 45 degrees when the electrical converter device is in its normal operation position. The angle can be, for example, substantially 90 degrees, i.e. the evaporator and condenser channels are in a substantially vertical position. In FIG. 3b, the xy-plane of a coordinate system 399 represents the horizontal plane. An arrow 370 represents a possible flowing direction of cooling air or other suitable cooling fluid. The evaporator and condenser channels are preferably longer in the z-direction of the coordinate system 399 than the first and second electrically conductive elements between which the semiconductor components are sandwiched. Hence, the cooling air can be directed to the walls of the condenser channels.

Figure 4A:
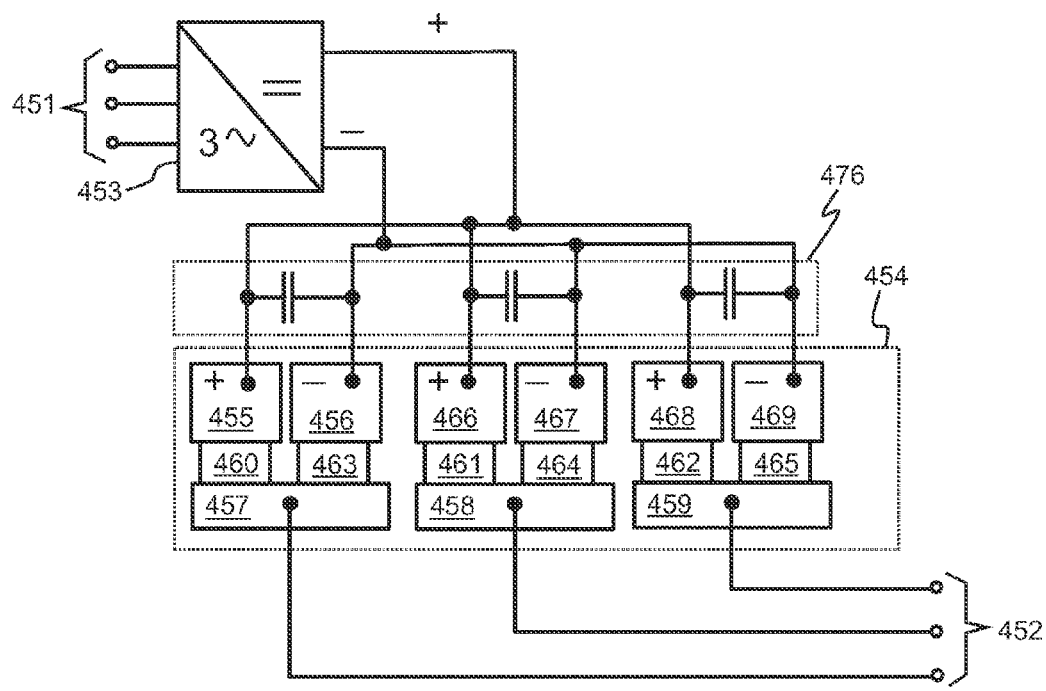
FIG. 4b shows a section view of a detail of the electrical converter device shown in FIG. 4a, and FIG. 5 is a flow chart of a method according to an embodiment of the invention for providing a cooling arrangement for one or more semiconductor components.

FIG. 4a shows an electrical converter device according to another embodiment of the invention. The electrical converter device comprises an electrical terminal 451 for connecting the electrical converter device to an alternating voltage network (not shown) and an electrical terminal 452 for connecting the electrical converter device to a load (not shown) that can be e.g. an induction motor. The electrical converter device comprises a converter unit 453 that can be e.g. a rectifier that is arranged to transfer energy from the alternating voltage network to an intermediate circuit 476 of the electrical converter device. The converter unit 453 can be as well a device that is capable of transferring energy not only from the alternating voltage network to the intermediate circuit 476 but also from the intermediate circuit back to the alternating voltage network.

Figure 4B:
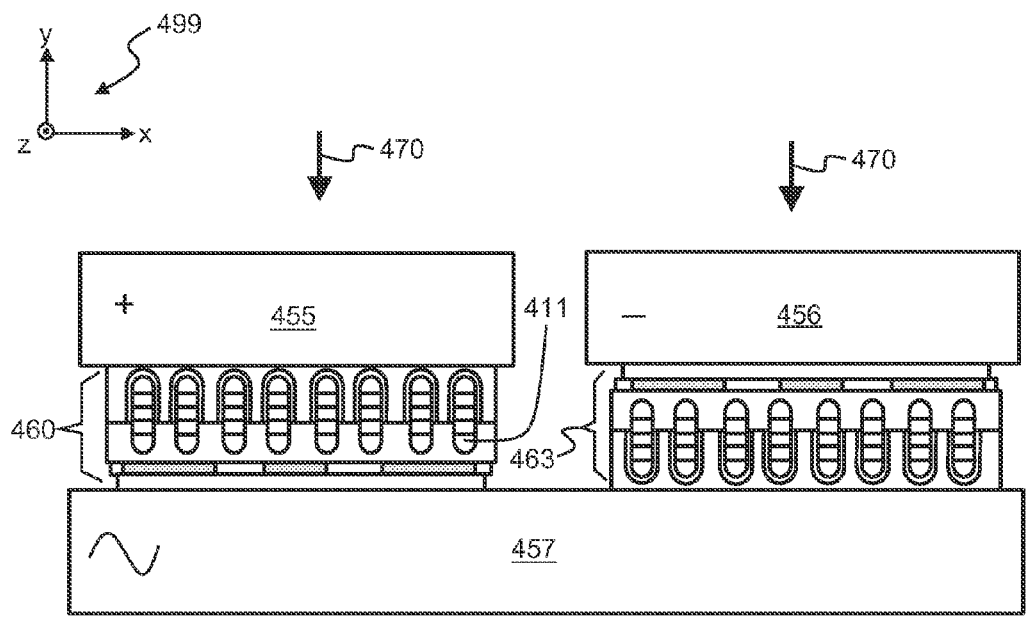

The electrical converter device comprises an inverter bridge 454 that is able to transfer energy from the intermediate circuit 476 to the load and also to transfer energy from the load to the intermediate circuit. The main circuit of the inverter bridge comprises bus-bars 455, 456, 466, 467, 468 and 469 that are connected to the intermediate circuit, and bus-bars 457, 458, and 459 that are connected to different phases of the electrical terminal 452. The main circuit of the inverter bridge comprises power-electronic arrangements 460, 461, 462, 463, 464, and 465 that are pressed between the bus-bars as shown in FIG. 4a. Each of the power-electronic arrangements can be, for example, according to what is described in FIGS. 1a, 1b and 1c and in the text passages related to these figures. The outer surfaces of the first and second electrically conductive elements of the power-electronic arrangements 460-465 are pressed against the bus-bars. This is illustrated in FIG. 4b for the power-electronic arrangements 460 and 463. The power-electronic arrangements 460 and 463 are depicted in FIG. 4b as section views that are similar to that shown in FIG. 1c. The reference number 411 represents one of the evaporation channels of the power-electronic arrangement 460. The semiconductor components of each of the power-electronic arrangements 460-465 may comprise, for example, one or more an insulated gate bipolar transistors (IGBT) and one or more diodes that are anti-parallel to the IGBTs.

An angle between a horizontal plane and the evaporator and condenser channels of the power-electronic arrangements 460-465 is preferably at least 45 degrees when the electrical converter device is in its normal operation position. The angle can be, for example, substantially 90 degrees, i.e. the evaporator and condenser channels are in a substantially vertical position. In FIG. 4b, the xy-plane of a coordinate system 499 represents the horizontal plane. An arrow 470 represents a possible flowing direction of cooling air or other suitable cooling fluid.

FIGS. 3a, 3b, 4a, and 4b depict electrical converter devices in which each power-electronic arrangement is pressed between a bus-bar of a direct voltage intermediate circuit and a bus-bar of an alternating voltage terminal. It is, however, also possible to have different mechanical constructions in electrical converter devices according to different embodiments of the invention. For example, using power electronic arrangements according to what is depicted in FIG. 2 would lead to a different mechanical construction.

Figure 5:
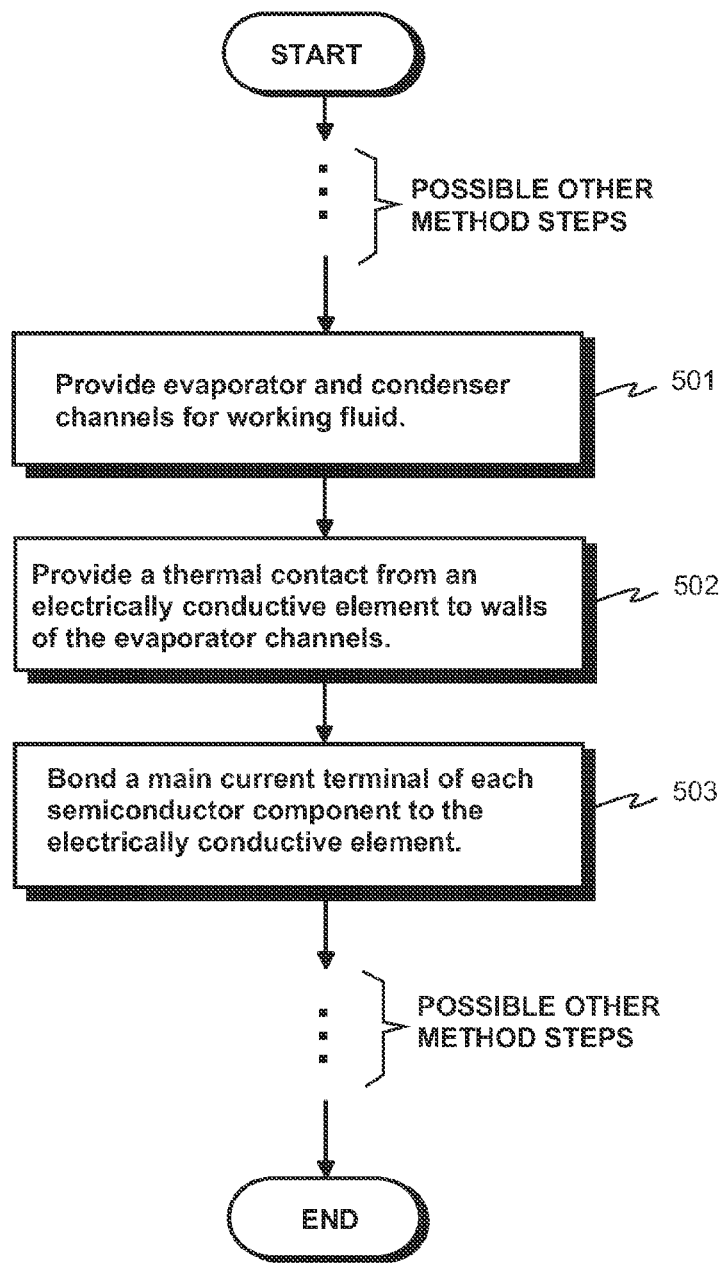

FIG. 5 is a flow chart of a method according to an embodiment of the invention for providing a cooling arrangement for one or more semiconductor components. The method comprises:
  providing, in a method step 501, at least one evaporator channel for working fluid and at least one condenser channel for the working fluid,
  providing, in a method step 502, a thermal contact from an electrically conductive element to an outer surface of a wall of the evaporator channel for transferring heat from the electrically conductive element to the evaporator channel, and
  bonding, in a method step 503, a main current terminal of each semiconductor component to the electrically conductive element.

A method according to an embodiment of the invention further comprises bonding another main current terminal of each semiconductor component to another electrically conductive element so that the one or more semiconductor components get sandwiched between the electrically conductive element and the other electrically conductive element.

A method according to another embodiment of the invention further comprises connecting a wire-bond to another main current terminal of each semiconductor component.

A method according to an embodiment of the invention comprises positioning the at least one evaporator channel so that an angle between a horizontal plane and the at least one evaporator channel is at least 45 degrees.

A method according to an embodiment of the invention comprises positioning the at least one evaporator channel so that the angle between the horizontal plane and the at least one evaporator channel is substantially 90 degrees.

In a method according to an embodiment of the invention, each of the semiconductor components is one of the following: an insulated gate bipolar transistor (IGBT), a field effect transistor (FET), a gate turn-off thyristor (GTO), a thyristor, a diode.

In a method according to an embodiment of the invention, the one or more semiconductor components comprise one or more insulated gate bipolar transistors (IGBT). A collector of each insulated gate bipolar transistor represents the main current terminal of that insulated gate bipolar transistor and an emitter of each insulated gate bipolar transistor represents the other main current terminal of that insulated gate bipolar transistor. The one or more semiconductor components may further comprise one or more diodes that are anti-parallel to the one or more insulated gate bipolar transistors.

The specific examples provided in the description given above should not be construed as limiting. Therefore, the invention is not limited merely to the embodiments described above, many variants being possible.

What is claimed is:

1. A power-electronic arrangement comprising:
  one or more semiconductor components,
  a heat exchanger comprising at least one evaporator channel for working fluid and at least one condenser channel for the working fluid, and
  an electrically conductive element comprising a contact surface providing a thermal contact to an outer surface of a wall of the evaporator channel for transferring heat from the electrically conductive element to the evaporator channel, wherein,
  a main current terminal of each of the one or more semiconductor components is bonded to the electrically conductive element,
  the heat exchanger is arranged to operate using the loop thermo-siphon principle, and
  the contact surface of the electrically conductive element is arranged to provide, in addition to the thermal contact, also a galvanic contact from the electrically conductive element to the outer surface of the wall of the evaporator channel.

2. A power-electronic arrangement according to claim 1, wherein the power-electronic arrangement further comprises another electrically conductive element, and wherein another main current terminal of each of the one or more semiconductor components is bonded to the other electrically conductive element, each of the one or more semiconductor components being sandwiched between the electrically conductive element and the other electrically conductive element.

3. A power-electronic arrangement according to claim 1, wherein the power-electronic arrangement further comprises one or more wire-bonds, each of which being connected to another main current terminal of one of the one or more semi-conductor components.

4. A power-electronic arrangement according to claim 1, wherein the at least one evaporator channel and the at least one condenser channel are formed with at least one conduit, each of which comprising an exterior wall and at least one interior wall.

5. A power-electronic arrangement according to claim 1, wherein each of the semiconductor components is one of the following: an insulated gate bipolar transistor (IGBT), a field effect transistor (FET), a gate turn-off thyristor (GTO), a thyristor, a diode.

6. A power-electronic arrangement according to claim 2, wherein the one or more semiconductor components comprise one or more insulated gate bipolar transistors (IGBT), a collector of each insulated gate bipolar transistor representing the main current terminal of that insulated gate bipolar transistor and an emitter of each insulated gate bipolar transistor representing the other main current terminal of that insulated gate bipolar transistor.

7. A power-electronic arrangement according to claim 6, wherein the one or more semiconductor components further comprise one or more diodes that are anti-parallel to the one or more insulated gate bipolar transistors.

8. An electrical converter device comprising at least one power-electronic arrangement each of which comprises:
  one or more semiconductor components,
  a heat exchanger comprising at least one evaporator channel for working fluid and at least one condenser channel for the working fluid, and
  an electrically conductive element comprising a contact surface providing a thermal contact to an outer surface of a wall of the evaporator channel for transferring heat from the electrically conductive element to the evaporator channel, wherein,
  a main current terminal of each of the one or more semiconductor components is bonded to the electrically conductive element,
  the electrically conductive element of each of at least one of the power-electronic arrangements constitutes a part of a main current circuitry of the electrical converter device,
  the heat exchanger is arranged to operate using the loop thermo-siphon principle, and
  the contact surface of the electrically conductive element is arranged to provide, in addition to the thermal contact, also a galvanic contact from the electrically conductive element to the outer surface of the wall of the evaporator channel.

9. An electrical converter device according to claim 8, wherein an angle between a horizontal plane and the at least one evaporator channel of the power-electronic arrangement is at least 45 degrees when the electrical converter device is in its operation position.

10. An electrical converter device according to claim 9, wherein the angle is substantially 90 degrees.

11. An electrical converter device according to claim 8, wherein the electrical converter device comprises a direct voltage intermediate circuit and an alternating voltage terminal, each power-electronic arrangement being pressed between a bus-bar of the direct voltage intermediate circuit and a bus-bar of the alternating voltage terminal.

12. A method for providing a cooling arrangement for one or more semiconductor components, the method comprising:
  providing a heat exchanger comprising at least one evaporator channel for working fluid and at least one condenser channel for the working fluid,
  providing a thermal contact from an electrically conductive element to an outer surface of a wall of the evaporator channel for transferring heat from the electrically conductive element to the evaporator channel, and
  bonding a main current terminal of each semiconductor component to the electrically conductive element,
  wherein the heat-exchanger operates using the loop thermo-siphon principle, and a galvanic contact is provided from the electrically conductive element to the outer surface of the wall of the evaporator channel when providing the thermal contact from the electrically conductive element to the outer surface of the wall of the evaporator channel.

13. A method according to claim 12, wherein the method further comprises bonding another main current terminal of each semiconductor component to another electrically conductive element so that the one or more semiconductor components get sandwiched between the electrically conductive element and the other electrically conductive element.

14. A method according to claim 12, wherein the method further comprises connecting a wire-bond to another main current terminal of each semiconductor component.

15. A method according to claim 12, wherein the method comprises positioning the at least one evaporator channel so that an angle between a horizontal plane and the at least one evaporator channel is at least 45 degrees.

* * * * *